United States Patent [19]
Wang et al.

[11] Patent Number: 5,837,053
[45] Date of Patent: Nov. 17, 1998

[54] PROCESS FOR PREPARING SINGLE CRYSTAL MATERIAL AND COMPOSITE MATERIAL FOR FORMING SUCH SINGLE CRYSTAL MATERIAL

[75] Inventors: Furen Wang, Tokyo; Tadataka Morishita, Kanagawa-ken, both of Japan

[73] Assignee: International Superconductivity Technology Center, Japan

[21] Appl. No.: 563,383

[22] Filed: Nov. 28, 1995

[30] Foreign Application Priority Data

Dec. 8, 1994 [JP] Japan ................................ 6-304735

[51] Int. Cl.$^6$ ........................................................ C30B 1/02
[52] U.S. Cl. ........................ 117/7; 117/8; 117/9; 117/947
[58] Field of Search ................................. 117/7, 8, 9, 947

[56] References Cited

U.S. PATENT DOCUMENTS

| | | | |
|---|---|---|---|
| 4,046,618 | 9/1977 | Chaudhari | 156/603 |
| 4,519,870 | 5/1985 | Matsuzawa et al. | 117/947 |
| 4,840,816 | 6/1989 | Appleton | 427/38 |
| 5,462,009 | 10/1995 | Garrigus | 117/7 |
| 5,593,495 | 1/1997 | Masuda et al. | 117/8 |

FOREIGN PATENT DOCUMENTS

| | | | |
|---|---|---|---|
| 0480789 | 9/1991 | European Pat. Off. | |
| 63-117985 | 5/1988 | Japan | 117/7 |
| 2-49232 | 2/1990 | Japan | 117/7 |

OTHER PUBLICATIONS

Higuchi et al, "Mircrostructure characterization of sol–gel derived PZT films", Journal of Materials Science, vol. 29 no. 2, pp. 436–441.

Applied Physics Letters, vol. 35, No. 4, Aug. 1979 pp. 327–329.

Japanese Journal of Applied Physics vol. 31, No. 11 Nov. 1992, pp. 3664–3666.

Primary Examiner—Robert Kunemund
Attorney, Agent, or Firm—Lorusso & Loud

[57] ABSTRACT

A single crystal material is prepared by forming a layer of an amorphous substance over a surface of a substrate of a single crystal having the same chemical composition as that of the amorphous substance, the resulting composite material is heated to epitaxially grow the amorphous layer into a single crystal layer. A composite material for producing such a single crystal material is also disclosed which includes a substrate of a single crystal, and a layer of an amorphous substance having the same chemical composition as that of the substrate, the layer having such a thickness that the layer as a whole can epitaxially grow to make a single crystal layer.

7 Claims, 3 Drawing Sheets

PROCESS FOR PREPARING SINGLE CRYSTAL MATERIAL AND COMPOSITE MATERIAL FOR FORMING SUCH SINGLE CRYSTAL MATERIAL

BACKGROUND OF THE INVENTION

This invention relates to a process for the preparation of a single crystal material useful as a substrate for forming a superconducting layer, a ferromagnetic layer or a ferroelectric layer thereon. The present invention is also directed to a composite material useful for forming such a single crystal material.

A single crystal substrate generally has surface defects, such as scratches and stains, formed chemically or physically during the manufacture thereof such as in a polishing step or during storage. Thus, it is desirable to recover such damaged surfaces prior to the use thereof.

In the field of semiconductors, a method is adopted in which a silicon single crystal is allowed to epitaxially grow, in a vapor phase, on a surface of a silicon single crystal substrate so that a clean silicon single crystal layer is newly formed thereon. This technique, however, cannot be applied to the formation of a metal oxide single crystal such as $SrTiO_3$, since it is extremely difficult to control the molar ratio thereof in an oxygen atmosphere.

SUMMARY OF THE INVENTION

It is, therefore, an object of the present invention to provide a process for the preparation of a single crystal material having a clean surface.

Another object of the present invention is to provide a process of the above-mentioned type which can produce a single crystal of a metal oxide having a perovskite structure.

It is a further object of the present invention to provide a composite material useful for forming the single crystal material.

In accomplishing the foregoing object, there is provided in accordance with one aspect of the present invention a process for the production of a single crystal material, which includes the steps of:

forming a layer of an amorphous substance over a surface of a substrate of a single crystal, the amorphous substance having the same chemical composition as that of the substrate, thereby obtaining a composite material; and heating the composite material to epitaxially grow said amorphous layer into a single crystal layer.

In another aspect, the present invention provides a composite material including a substrate of a single crystal, and a layer of an amorphous substance having the same chemical composition as that of the substrate, the layer having such a thickness that the entire of the layer can epitaxially grow to make a single crystal layer.

BRIEF DESCRIPTION OF THE DRAWINGS

Other objects, features and advantages of the invention will become apparent from the detailed description of the preferred embodiments of the invention which follows, when considered in light of the accompanying drawings, in which.

DETAILED DESCRIPTION OF THE PREFERRED EMBODIMENTS OF THE INVENTION

Figure 1:
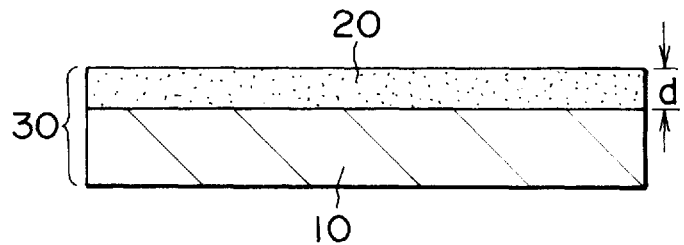
FIG. 1 is a sectional view schematically showing a composite material according to the present invention.

Referring to FIG. 1, the reference numeral 30 designate a composite material according to the present invention. The composite material 30 includes a substrate 10 of a single crystal, and a layer 20 of an amorphous substance having the same chemical composition as that of the substrate 10.

The substrate 10 is preferably a single crystal having a perovskite structure. Such a perovskite single crystal may be an oxide having the formula $ABO_3$ wherein A represents an element selected from alkaline earth metals and lanthanoid elements and B represents a metal selected from those belonging to IVB and IIIA of the Periodic Table. Illustrative of suitable elements A are Sr, La and Nd, while illustrative of suitable elements B are Ti, Ga and Al.

The composite material 30 may be produced by forming the amorphous layer 20 over a surface of the substrate 10 by any suitable known method such as by laser ablation or sputtering.

The amorphous layer 20 of the composite material 30 can be converted and recrystallized into an orderly oriented single crystal layer by a heat treatment (annealing). It is important that the layer 20 should have such a thickness d that the entire of the layer 20 can epitaxially grow to make a single crystal layer. Preferably, the thickness d of the layer 20 is 100 Å or less.

Figure 5:
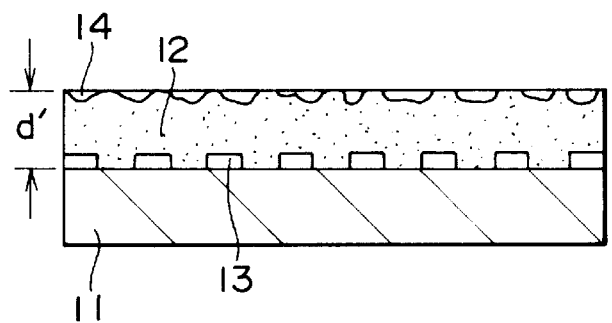
FIG. 5 is a sectional view explanatory of a failed case.

When the amorphous layer 20 has an excessively large thickness, it becomes impossible for the entirety of the layer 20 to epitaxially grow into a single crystal layer. The failure of the epitaxial growth is schematically illustrated in FIG. 5, in which designated as 11 is a single crystal substrate and as 12 is an amorphous layer of the same composition as that of the substrate 11. When the amorphous layer 12 on the substrate 11 is subjected to a heat treatment, single crystals 13 epitaxially grow from the interface between the substrate 11 and the amorphous layer 12 toward the opposite surface of the amorphous layer 12. In this case, however, when the thickness d' of the amorphous layer 12 is excessively large, the nucleation occurs in portions adjacent to the surface of the amorphous layer 12, so that single crystals 14 oriented at random are formed. As a result, there are grown both orderly oriented single crystal layer and randomly oriented single crystal layer on the substrate 11.

The heat treatment of the composite material 30 may be performed at a temperature of up to 1,100° C., preferably 500°–1,100° C. in an oxygen atmosphere. Alternatively, the annealing may be performed at a temperature of up to 900° C., preferably 800°–900° C. and a pressure of $2\times10^{-6}$ Torr or less.

The following examples will further illustrate the present invention.

EXAMPLE 1

A commercially available $SrTiO_3$ (100) single crystal substrate was subjected to laser ablation at room temperature to form a composite substrate (I) having an amorphous layer with a thickness of 48 Å on the substrate. Similar procedure was repeated to obtain composite substrates (II) and (III) having amorphous layers with thickness' of 80 Å and 276 Å, respectively.

EXAMPLE 2

Each of the composite substrates (I)–(III) obtained in Example 1 was heated at various temperatures of 500° C., 700° C., 900° C. and 1,100° C. for 30 minutes in an oxygen atmosphere of 1 atm to obtain single crystal materials.

Figure 2:
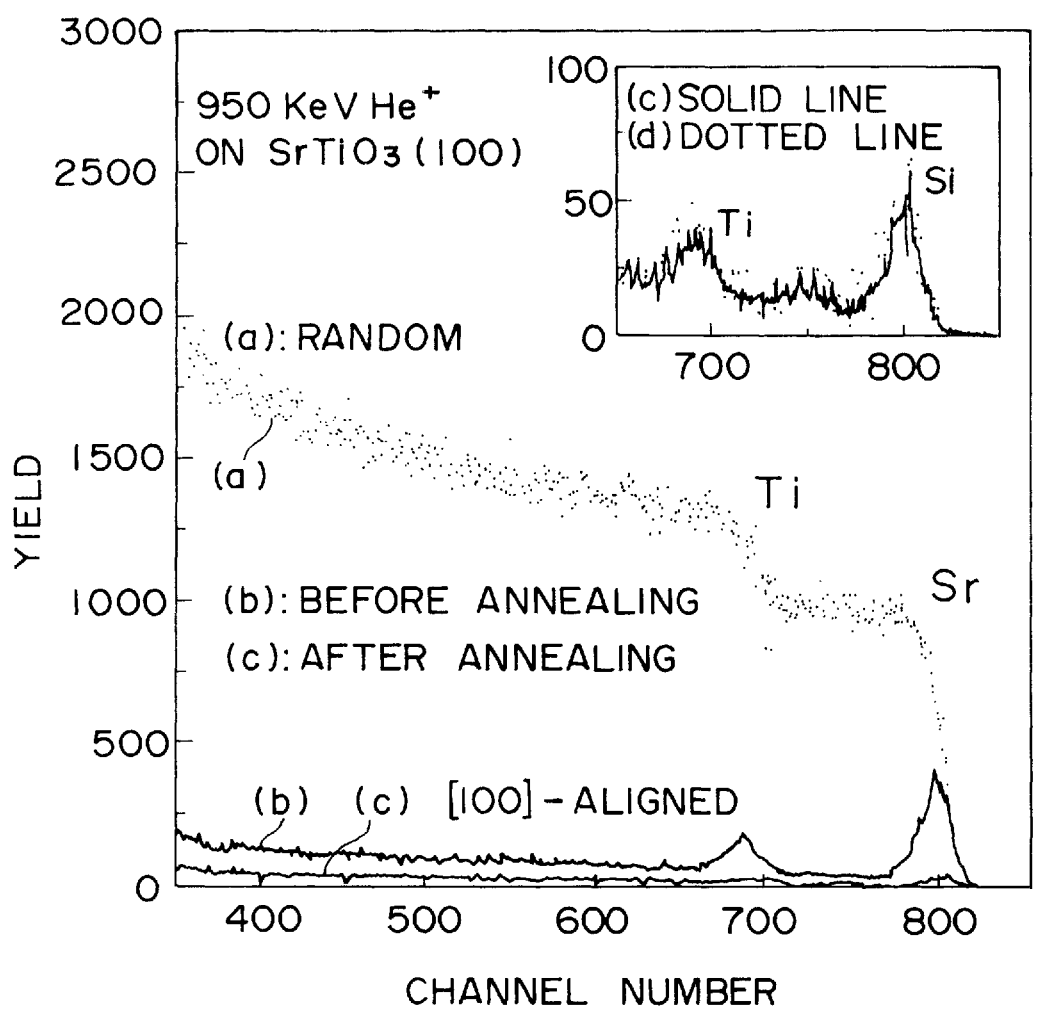
FIG. 2 shows Rutherford backscattering spectra of a $SrTiO_3$ single crystal material obtained in Example 2.

The single crystal material obtained by heating the composite substrate (II) at the 1,100° C. annealing temperature was evaluated for the crystallinity thereof by the ion channeling measurement using a 950 KeV He$^+$ ion beam. FIG. 2 shows the random and [100]-aligned Rutherford backscattering spectra (RBS), wherein the abscissa represents the channel number and the ordinate represents the backscattering yield corresponding to the number of the backscattered ions. The spectrum (a) shows the random RBS for the single crystal material obtained by annealing the composite substrate (II), the spectrum (b) shows the [100]-aligned RBS for the composite substrate (II), and the spectrum (c) shows the [100]-aligned RBS for the single crystal material obtained by annealing the composite substrate (II). A fragmentary, enlarged view of the spectrum (c) is also shown in FIG. 2 and is indicated by the solid line. The spectrum (d) in the dotted line shows the [100]-aligned RBS for the commercially available SrTiO$_3$ single crystal substrate used in Example 1.

As will be appreciated from FIG. 2, the backscattering yield of the spectrum (c) is smaller than that of the spectrum (d). It follows that the crystallinity of the single crystal film epitaxially grown on the commercially available single crystal substrate is better than that of the substrate.

Figure 3:
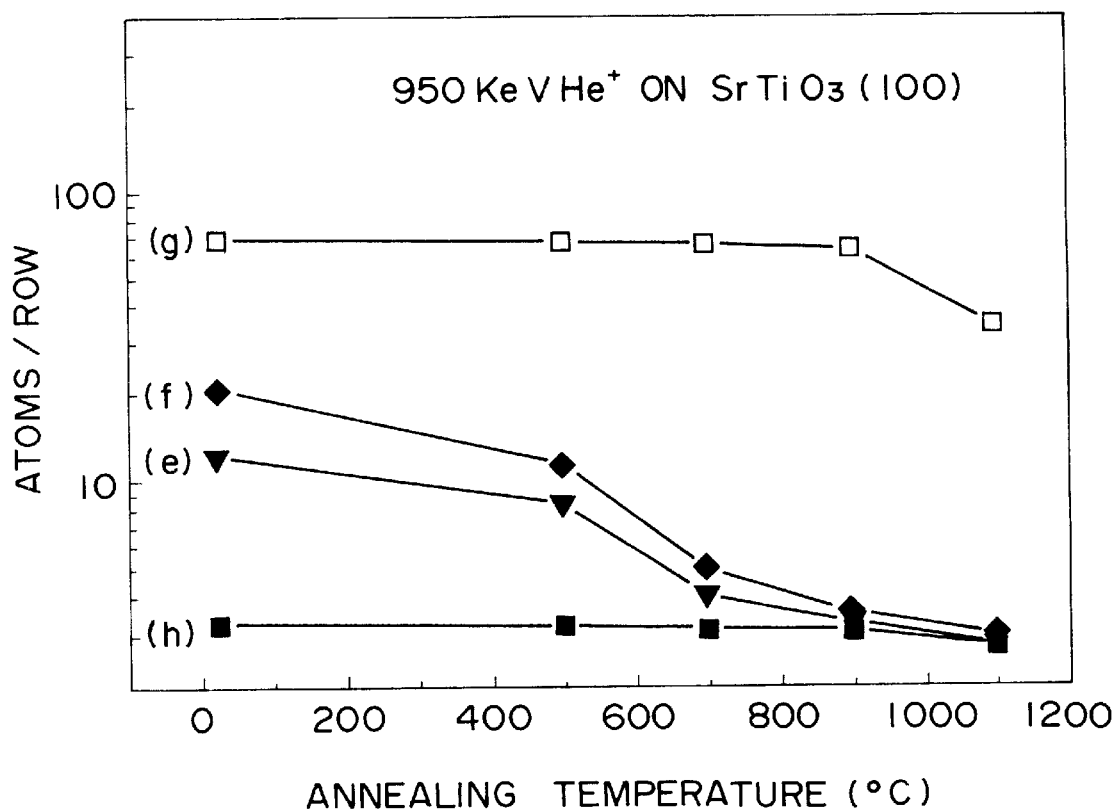
FIG. 3 shows a relationship between the number of atoms in one raw as viewed in the channeling direction and the annealing temperature of $SrTiO_3$ single crystal materials obtained in Example 2.

FIG. 3 shows the annealing temperature dependency of the number of atoms per one row in the channel direction (SPA) measured by the ion channeling using a 950 KeV He$^+$ ion beam. The plots (e), (f) and (g) are for the single crystal materials obtained by annealing the composite substrates (I), (II) and (III), respectively, while the plot (h) is for the commercially available SrTiO$_3$ single crystal substrate used in Example 1.

As will be appreciated from FIG. 3, when the annealing temperature is about 900° C. or more, the numbers of atoms in the case of the plots (e) and (f) are similar to or greater than that of the plot (h). It follows that the crystallinity of the single crystal film with a thickness of 48 Å or 80 Å epitaxially grown on the commercially available single crystal substrate is comparable to or better than that of the substrate.

EXAMPLE 3

The composite substrate (I) obtained in Example 1 was heated at various temperatures of up to 850° C. for 30 minutes under a pressure of 4×10$^{-7}$ to 10×$^{-6}$ Torr to obtain single crystal materials.

Figure 4:
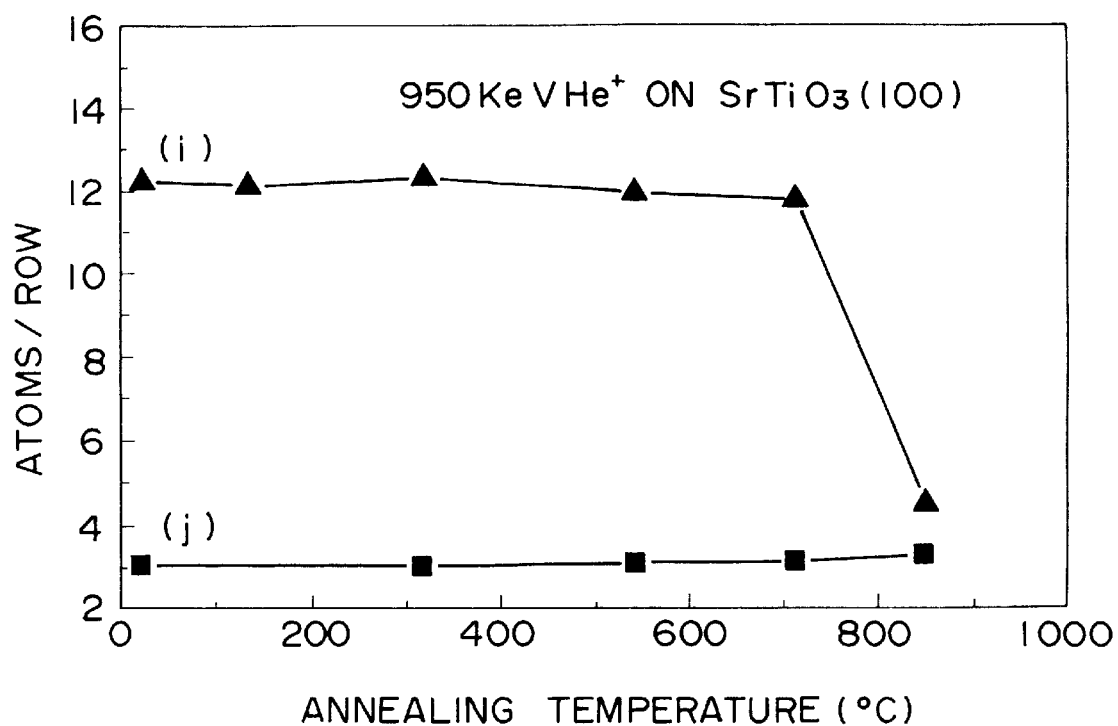
FIG. 4 shows a relationship between the number of atoms in one raw as viewed in the channeling direction and the annealing temperature of $SrTiO_3$ single crystal material obtained in Example 3.

FIG. 4 shows the annealing temperature dependency of the number of atoms per one row in the channel direction measured by the ion channeling using a 950 KeV He$^+$ ion beam. The plot (i) is for the single crystal material obtained by annealing the composite substrates (I), while the plot (j) is for the commercially available SrTiO$_3$ single crystal substrate used in Example 1.

As will be appreciated from FIG. 4, when the annealing temperature is about 850° C., the number of atoms in the case of the plot (i) is similar to that of the plot (j). It follows that the crystallinity of the single crystal film with a thickness of 48 Å epitaxially grown on the commercially available single crystal substrate is comparable to that of the substrate.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A process for the production of a single crystal material, comprising the steps of:

forming a layer of an amorphous substance over a surface of a substrate of a single crystal, said amorphous substance having the same chemical composition as that of said substrate and said layer having a thickness of 100 Å or less, thereby obtaining a composite material; and heating said composite material to epitaxially grow said amorphous layer, in its entirety, into a single crystal layer.

2. A process as claimed in claim 1, wherein said substrate is a single crystal having a perovskite structure.

3. A process as claimed in claim 1, wherein said heating is performed at a temperature of 1,100° C. or less in an oxygen atmosphere.

4. A process as claimed in claim 1, wherein said heating is performed at a temperature of 900° C. or less and a pressure of 2×10$^{-6}$ Torr or less.

5. A process as claimed in claim 2 wherein said single crystal is selected from the group consisting of SrTiO$_3$, NdGaO$_3$ and LaAlO$_3$.

6. A composite material comprising a substrate of a single crystal having a perovskite structure and a layer of an amorphous substance having the same chemical composition as that of said substrate, said layer having a thickness 100 Å or less, whereby the entirety of said layer can epitaxially grow to make a single crystal layer.

7. A composite material as claimed in claim 6, wherein said single crystal is selected from the group consisting of SrTiO$_3$, NdGaO$_3$ and LaAlO$_3$.

* * * * *